(12) United States Patent
Ting et al.

(10) Patent No.: US 10,930,196 B2
(45) Date of Patent: Feb. 23, 2021

(54) DISPLAY DEVICE AND MANUFACTURING METHOD OF DISPLAY SUBSTRATE

(71) Applicant: InnoLux Corporation, Miao-Li County (TW)

(72) Inventors: Chin-Lung Ting, Miao-Li County (TW); Ming-Chun Tseng, Miao-Li County (TW); Liang-Lu Chen, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/364,154

(22) Filed: Mar. 25, 2019

(65) Prior Publication Data

US 2019/0325807 A1 Oct. 24, 2019

Related U.S. Application Data

(60) Provisional application No. 62/659,712, filed on Apr. 19, 2018.

(30) Foreign Application Priority Data

May 7, 2018 (CN) .......................... 201810427605.7

(51) Int. Cl.
*H01L 27/00* (2006.01)
*G09G 3/20* (2006.01)
*H01L 27/32* (2006.01)

(52) U.S. Cl.
CPC ....... *G09G 3/2088* (2013.01); *H01L 27/3276* (2013.01); *G09G 2310/0264* (2013.01)

(58) Field of Classification Search
CPC ............. H01L 27/3223; H01L 27/3276; H01L 27/3244; H01L 27/3204; G09G 3/3426; G09G 3/36; G09G 3/20; G09G 3/2088; G09G 3/3233; G09G 2300/0819; G09G 2300/0426; G09G 2310/0264; G09G 2320/0233; G09G 2300/0413; G09G 2330/08; G09G 2330/10

See application file for complete search history.

(56) References Cited

U.S. PATENT DOCUMENTS

| | | | |
|---|---|---|---|
| 7,898,611 B2 * | 3/2011 | Yu | G02F 1/133608 349/150 |
| 7,935,959 B2 * | 5/2011 | Tang | G09G 3/3233 257/40 |
| 8,698,706 B1 | 4/2014 | Rutherford | |
| 2004/0066146 A1 | 4/2004 | Park | |
| 2007/0146248 A1 * | 6/2007 | Guo | G09G 3/325 345/76 |
| 2007/0146570 A1 * | 6/2007 | Yu | G02F 1/133608 349/58 |

FOREIGN PATENT DOCUMENTS

| | | |
|---|---|---|
| CN | 100423061 C | 10/2008 |
| EP | 3 163 559 A1 | 5/2017 |

* cited by examiner

*Primary Examiner* — Nikolay K Yushin
(74) *Attorney, Agent, or Firm* — Winston Hsu

(57) ABSTRACT

A display device includes a substrate, at least one light emitting element and at least two driving arrays. The at least one light emitting element is disposed on the substrate, and the at least one light emitting element has a first terminal and a second terminal. The at least two driving arrays are disposed on the substrate, and one of the at least two driving arrays is electrically connected to the first terminal of the at least one light emitting element.

19 Claims, 10 Drawing Sheets

DISPLAY DEVICE AND MANUFACTURING METHOD OF DISPLAY SUBSTRATE

CROSS REFERENCE TO RELATED APPLICATION

This patent application claims the benefit of U.S. provisional application No. 62/659,712, filed Apr. 19, 2018, and the entire contents of which are incorporated herein by reference.

BACKGROUND OF THE DISCLOSURE

1. Field of the Disclosure

The present disclosure relates to a display device and a related manufacturing method of a display substrate, and more particularly, to a display device structure and a related manufacturing method of a display substrate that can increase the yield of the display device.

2. Description of the Prior Art

Flat display and curved display device have gradually become the main products in the display device market due to characteristics of light weight and thin thickness, such as for applying to household televisions, personal computer monitors, and portable electronic devices such as phones, digital cameras and tablet computers. The design of the light source of flat display device and curved panel display device may include disposing conductive wires, electronic elements and light emitting elements on a substrate, and the electronic elements and conductive wires are used for transmitting signals to control the brightness or darkness of the display device. However, in the manufacturing technology of the prior arts, the inspection of the electronic elements is performed after the above elements are manufactured, and the corresponding light emitting elements will not emit light normally if any defect of the conductive wire or the electronic device occurs, which results in that the whole substrate has to be discarded. In the present technology, no appropriate repairing mechanism could repair the electronic elements or the conductive wires without damaging the light emitting elements, the circuit layout or the substrate. Therefore, once there is any defect in the substrate, the substrate and the light emitting elements as a whole have to be discarded even if the light emitting elements are intact, thus becoming a waste of the light emitting elements and other elements.

SUMMARY OF THE DISCLOSURE

The present disclosure provides a display device that includes a substrate and a light emitting unit, wherein the light emitting unit includes at least one light emitting element and at least two driving arrays. The at least one light emitting element is disposed on the substrate, and the at least one light emitting element has a first terminal and a second terminal. The at least two driving arrays are disposed on the substrate, wherein one of the at least two driving arrays is electrically connected to the first terminal of the at least one light emitting element.

The present disclosure provides a manufacturing method of a display substrate, which comprises:
providing a substrate;
disposing at least two driving arrays on the substrate;
inspecting one of the at least two driving arrays, so as to confirm that at least one of the at least two driving arrays is qualified;
disposing at least one light emitting element on the substrate;
disposing at least one conductive element on the substrate; and
electrically connecting the at least one light emitting element to one of the at least two driving arrays that is qualified.

The present disclosure provides a further manufacturing method of a display substrate, which comprises:
providing a substrate;
disposing at least two driving arrays on the substrate;
disposing at least one light emitting element on the substrate; and
electrically connecting the at least one light emitting element to one of the at least two driving arrays;
inspecting at least one of the at least two driving arrays; and
when an inspection result confirmed that one of the at least two driving array is unqualified, removing electrical connection between the unqualified driving array and the light emitting element and electrically connecting the light emitting element to another one of the at least two driving arrays.

These and other objectives of the present disclosure will no doubt become obvious to those of ordinary skill in the art after reading the following detailed description of the embodiment that is illustrated in the various figures and drawings.

DETAILED DESCRIPTION

Figure 1:
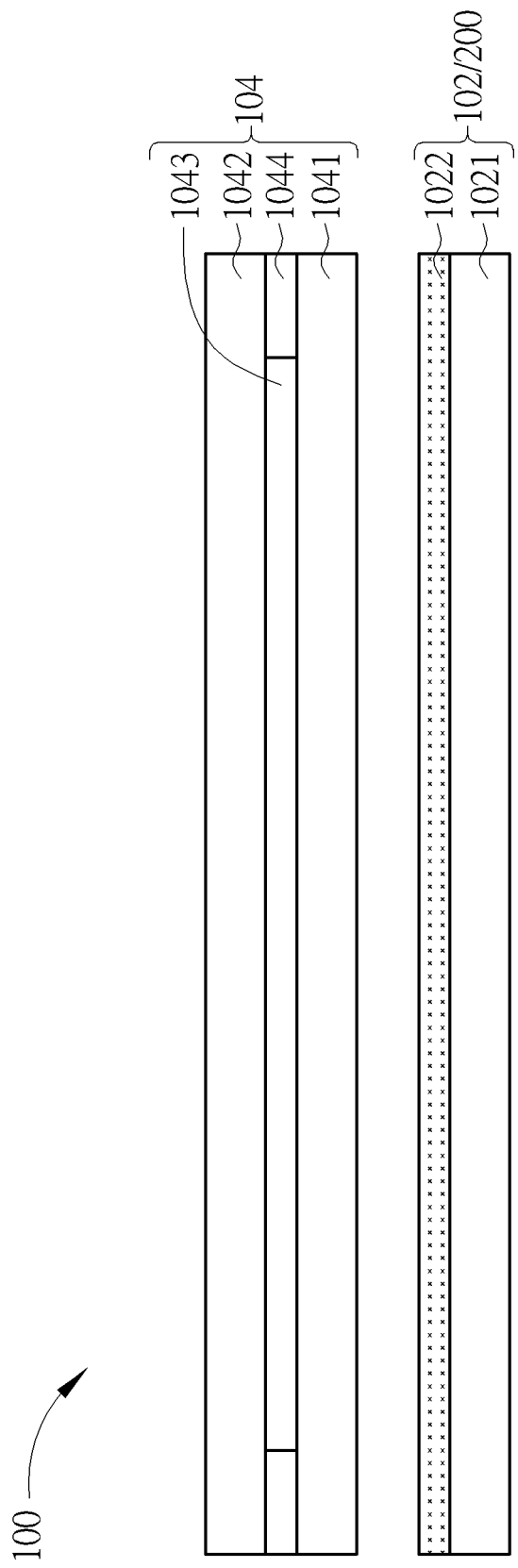
FIG. 1 is a cross-sectional schematic diagram of a structure of a display device according to a first embodiment of the present disclosure.

To provide a better understanding of the present disclosure to those skilled in the art, embodiments will be detailed as follows. The preferred embodiments of the present disclosure are illustrated in the accompanying drawings with numbered elements to elaborate on the contents and effects to be achieved. It is needed to note that the drawings are simplified schematic diagrams, and therefore, the drawings show only the components and combinations associated with the present disclosure, so as to provide a clearer description of the basic architecture or method of implementation of the present disclosure. The components would be complex in reality. In addition, for explanation, the components shown in the drawings of the present disclosure are not drawn to the actual number, shape, and dimensions, and the detail can be adjusted according to the design requirements.

When the terms "include", "comprise" and/or "have" are used in the description of the present disclosure, the corresponding features, areas, regions, steps, operations and/or components would be pointed to existence, but not limiting the existence or addition of one or more corresponding or other features, areas, regions, steps, operations and/or components. When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them. And, when the component is referred to "be coupled to another component (or the variant thereof)", it may be directly connected to another component, or may be indirectly connected (such as electrically connected) to another component through other component or components.

It should be noted that the technical features in different embodiments described in the following can be replaced, recombined, or mixed with one another to constitute another embodiment without departing from the spirit of the present disclosure.

The disclosed technical features in the present disclosure may apply for liquid crystal display (LCD), electroluminescent display (ELD), organic light emitting diode display (OLED display), inorganic light emitting diode display (LED display), quantum dot display (QD display) and so on. In view of simplification, only some of examples will be described as follows.

Figure 2:
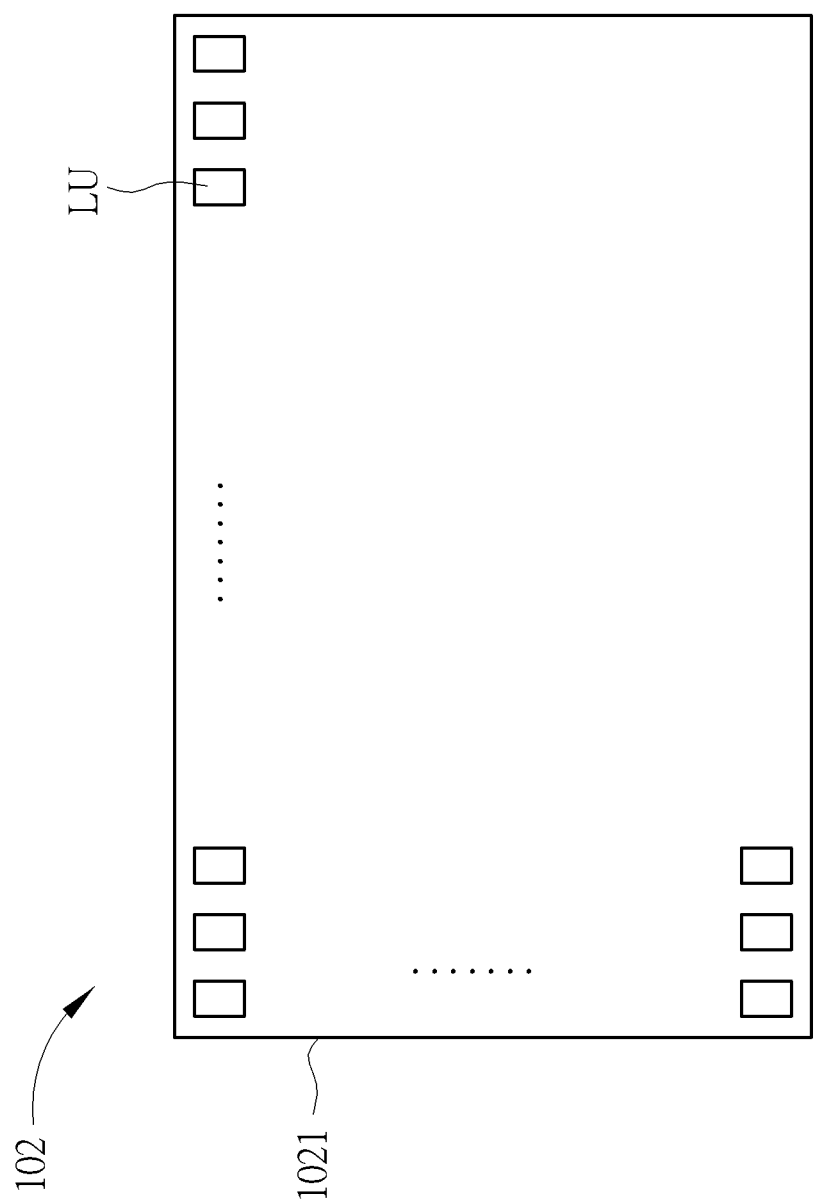
FIG. 2 is a top-view schematic diagram of a substrate of the display device shown in FIG. 1.
Figure 3:
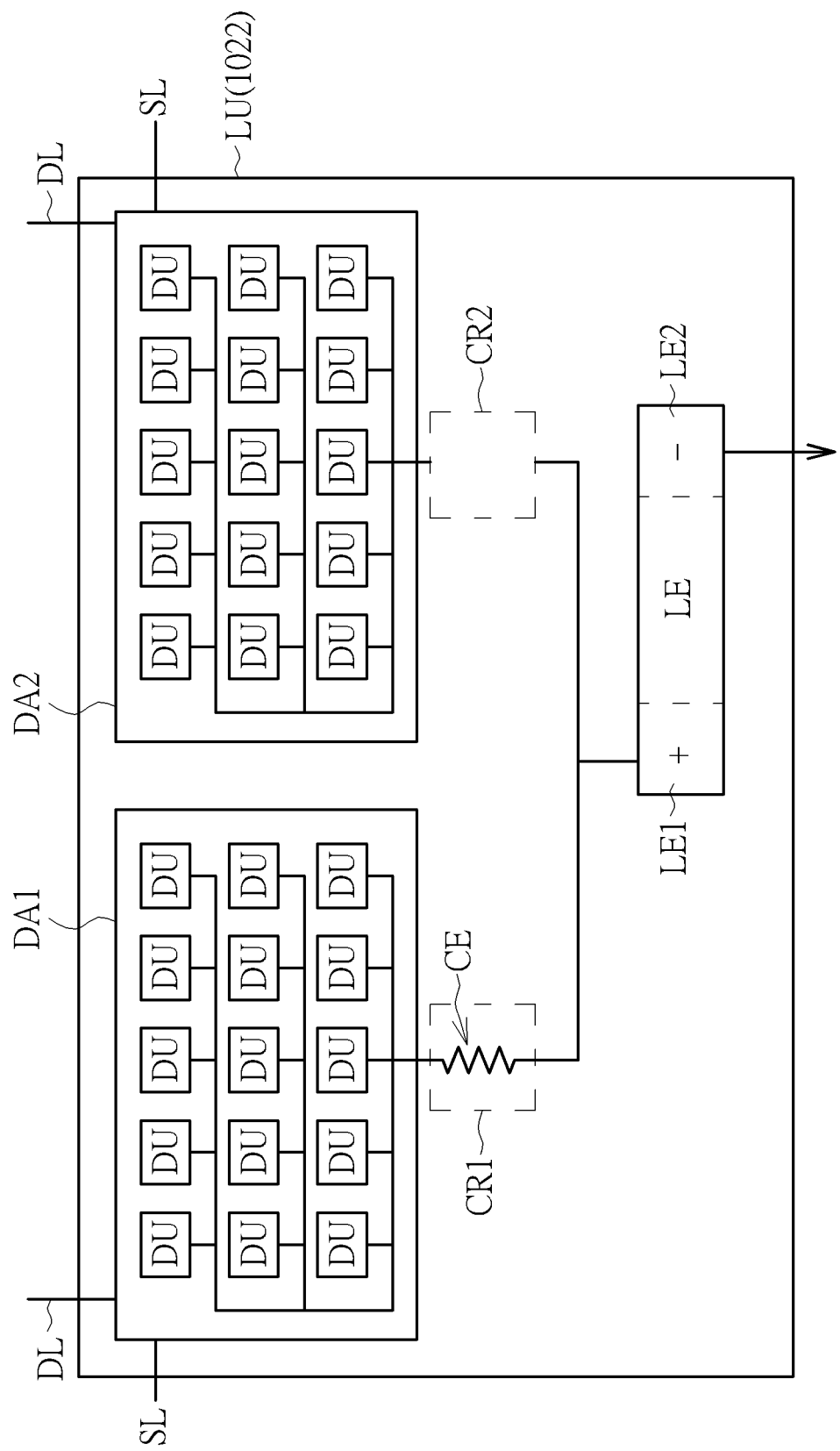
FIG. 3 is an element arrangement schematic diagram of a single light emitting unit shown in FIG. 2.
Figure 4:
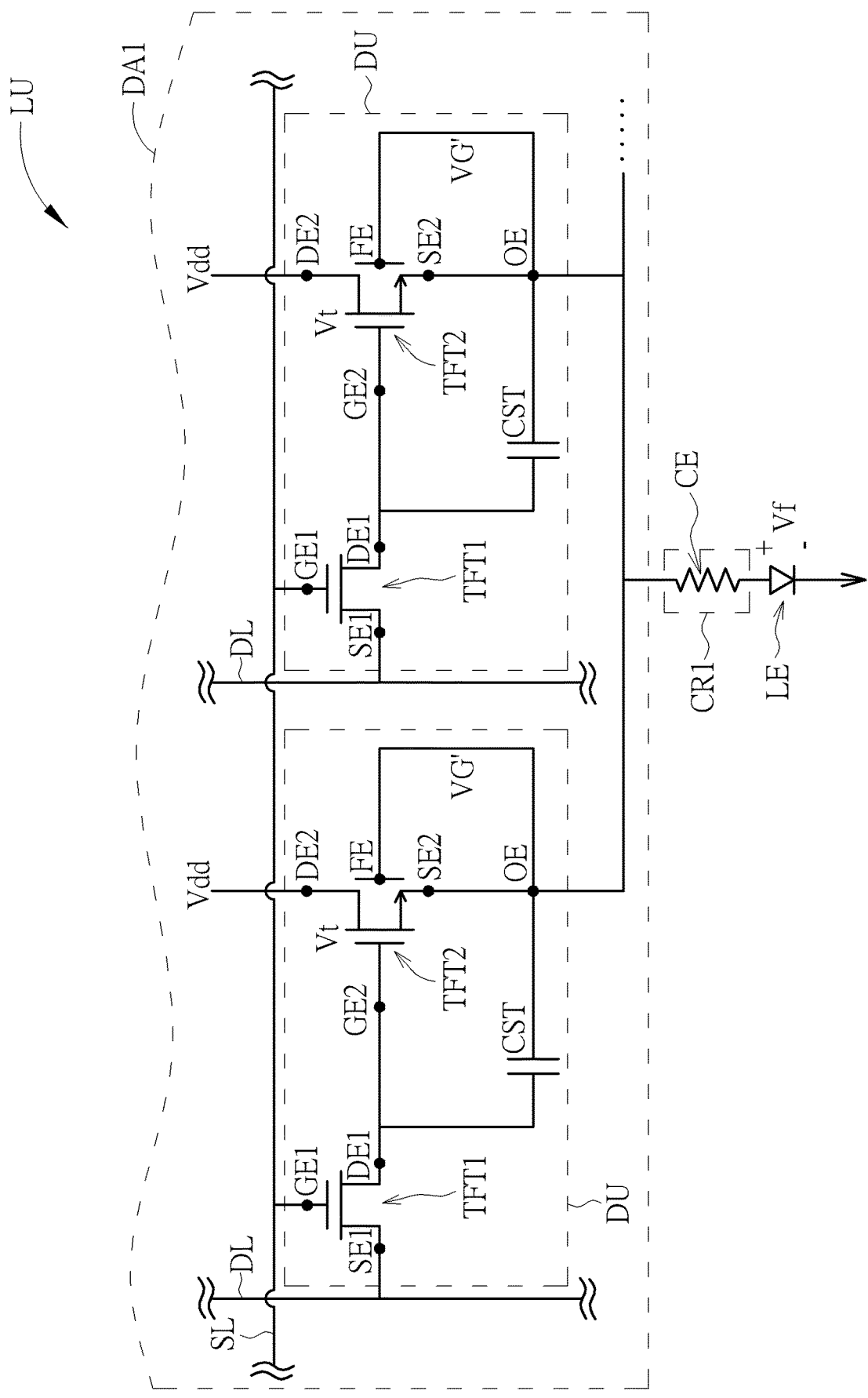
FIG. 4 is a partial equivalent circuit schematic diagram of a single driving array shown in FIG. 3.

Referring to FIG. 1 to FIG. 4, FIG. 1 to FIG. 4 are schematic diagrams of structure and arrangement of elements of a display device according to a first embodiment of the present disclosure, wherein FIG. 1 is a cross-sectional schematic diagram of a structure of the display device according to the first embodiment of the present disclosure, FIG. 2 is a top-view schematic diagram of the substrate of the display device shown in FIG. 1, FIG. 3 is an element arrangement schematic diagram of a single light emitting unit shown in FIG. 2, and FIG. 4 is a partial equivalent circuit schematic diagram of a single driving array shown in FIG. 3. First, referring to FIG. 1 and FIG. 2, the present disclosure provides a display device 100. In this embodiment, the display device 100 may for example be a display such as (but not limited to) a liquid crystal display (LCD) that includes a backlight source 102 and a display panel 104. The display panel 104 for example may include a first substrate 1041, a second substrate 1042 and a display media layer 1043 between the first substrate 1041 and the second substrate 1042, and a sealant layer 1044 may be disposed between the first substrate 1041 and the second substrate 1042 to fix the first substrate 1041 and the second substrate 1042. When the display panel 104 is a liquid crystal display panel, the display media layer 1043 may be a liquid crystal layer, the first substrate 1041 and the second substrate 1042 may be a transparent substrate respectively. For example, the first substrate 1041 and the second substrate 1042 may independently be a hard substrate such as a glass substrate, a quartz substrate, and a sapphire substrate or a flexible substrate such as a plastic substrate that includes polyimide (PI), polycarbonate (PC) or polyethylene terephthalate (PET), but not limited thereto. It is noted that some of the elements on the surfaces of the first substrate 1041 and the second substrate 1042 of FIG. 1 are omitted, such as circuit arrays, conductive lines, color filters, light shielding layer, but not limited thereto. In another aspect, the backlight source 102 of the present disclosure includes at least one light emitting unit LU disposed on the surface of a substrate 1021. For example, the backlight source 102 of this embodiment may be an active-type backlight source that includes a plurality of light emitting units LU arranged in an array on the substrate 1021. The light emitting units LU arranged in an array and the related circuits are illustrated as a light emitting array layer 1022 in FIG. 1. As shown in FIG. 1, the display panel 104 is disposed at a side of the substrate 1021, wherein the display panel 104 in this embodiment is disposed at the side of the substrate 1021 that has light emitting units LU or light emitting array layer 1022 disposed thereon, but not limited thereto. The material of the substrate 1021 of the present disclosure may be equal to or not equal to the first substrate 1041 and the second substrate 1042, and the material of the substrate 1021 may refer to the material of the first substrate 1041 and the second substrate 1042 described above and not be described redundantly.

Referring to FIG. 3 and FIG. 4, the light emitting array layer 1022 includes at least one light emitting element LE and at least two driving arrays disposed on the substrate 1021, wherein the symbols DA1 and DA2 respectively represent one of the two driving arrays. As an example, one light emitting unit LU in this embodiment has two driving arrays DA1, DA2 and one light emitting element LE. That is, at least two driving arrays DA1, DA2 and at least one light emitting element LE compose a light emitting unit LU. The light emitting element LE has a first terminal LE1 and a second terminal LE2, wherein the first terminal LE1 and the second terminal LE2 for example may respectively be the anode and cathode of the light emitting element LE, but not limited thereto. The light emitting element LE may be any light emitting element, such as (but not limited to) a normal size light emitting diode (normal LED), a mini size light emitting diode (mini LED), a micro size light emitting diode (micro LED), an organic light emitting diode (OLED) or a quantum light emitting diode (QLED). Each of the driving arrays DA1, DA2 includes at least one driving unit DU. One of the driving arrays DA1, DA2 is electrically connected to the first terminal LE1 of the light emitting element LE, and the other one of the driving arrays DA1, DA2 is electrically isolated from the light emitting element LE. In this embodiment, each of the driving arrays DA1, DA2 includes a plurality of driving units DU, and the driving units DU are electrically connected to each other in parallel and arranged in their corresponding driving array DA1 or DA2. With such a design, the driving units DU connected in parallel may increase the total output current of one single driving array DA1 or DA2, so as to increase the brightness of the light emitting element LE. For example, one driving array DA1 or DA2 may include 1 to 108 driving units DU arranged in an array, or may include 1 to 168 driving units DU arranged in an array, but not limited thereto. In this embodiment, the light emitting unit LU of the display device 100 further includes a conductive element CE disposed between one of the at least two driving arrays DA1, DA2 and the light emitting element LE, and the conductive element CE is electrically connected between one of the driving arrays DA1, DA2 and the light emitting element LE. In other words, in one light emitting unit LU, only one of the driving arrays DA1 or DA2 would be electrically connected to the first terminal LE1 of the light emitting element LE through the conductive element CE, and the other driving array DA1 or DA2 is not electrically connected to the light emitting element LE through the conductive element CE, that is, the other driving array DA1 or DA2 is electrically isolated from the light emitting element LE. The conductive element CE of the present disclosure may include a zero-ohm resistor (a resistor with zero resistance), a conductive line or a Zener diode. For example, the conductive element CE in this embodiment is a zero-ohm resistor, but not limited thereto. Any appropriate conductive element with a low resistance, a resistance approaching to zero, or nearly without causing voltage drop may be applied to the conductive element CE of the present disclosure. The resistance of the conductive element CE may be in the range between 10 million ohms and 0 ohm, in the range between 50 ohms and 0 ohm, or in the range between 5 ohms and 0 ohm.

As shown in FIG. 4, taking the driving array DA1 as an example, the driving array DA1 includes at least one data line DL and at least one scan line SL, and the data line DL and the scan line SL are electrically connected to one or more corresponding driving units DU in the driving array DA1. Each of the driving units DU includes a first transistor TFT1, a second transistor TFT2 and a capacitor CST. The first transistor TFT1 may serve as a switch element of the driving unit DU and may include a gate electrode GE1, a source electrode SE1, and a drain electrode DE1. The gate electrode GE1 is electrically connected to the corresponding scan line SL, and the source electrode SE1 is electrically connected to the corresponding data line DL. The second transistor TFT2 may serve as a driving element of the driving unit DU and may include a gate electrode GE2, a source electrode SE2, and a drain electrode DE2. The gate electrode GE2 is electrically connected to the drain electrode DE1 of the first transistor TFT1, the source electrode SE2 is electrically connected to an output terminal OE of the driving unit DU, and the drain electrode DE2 is electrically connected to a working voltage source Vdd. A first electrode of a capacitor CST is electrically connected to the drain electrode DE1 of the first transistor TFT1 and the gate electrode GE2 of the second transistor TFT2, and a second electrode of the capacitor CST is electrically connected to the output terminal OE of the driving unit DU and the source electrode SE2 of the second transistor TFT2. The driving unit DU is not limited to the design of having two transistors and one capacitor (2T1C). In variant embodiments, the driving unit DU may include various numbers of transistors and capacitors. For example, the driving unit DU may include (but not limited to) seven transistors and one capacitor (7T1C). According to the present disclosure, the second transistor TFT2 of the driving unit DU may be a transistor having four terminal-electrodes, and therefore the second transistor TFT2 further includes a fourth electrode FE which is electrically connected to the second electrode of the capacitor CST, the source electrode SE2 of the second transistor TFT2 and the output terminal OE of the driving unit DU at the same time. Since the threshold voltage Vt of a normal transistor may shift, the present disclosure may reduce the variation of the threshold voltage Vt through electrically connecting the fourth electrode FE and the source electrode SE2 of the second transistor TFT2. In addition, the design of the present disclosure makes the fourth electrode FE of the second transistor TFT2 be electrically connected to the source electrode SE2 of the second transistor TFT2 and the output terminal OE of the driving unit DU, that is, be electrically connected to the light emitting element LE, so as to provide a compensation effect to the light emitting element LE through the voltage VG' of the fourth electrode FE and mitigate the mura phenomenon of non-uniform brightness resulted from the variations of the voltage Vf of each light emitting element LE in prior art. However, the present disclosure is not limited to the above description. In some variant embodiments, the second transistor TFT2 may not include the fourth electrode FE.

According to the present disclosure, one of the advantages of disposing at least two driving arrays DA1 and DA2 in the light emitting unit LU is that when one of the driving arrays DA1 and DA2 has defects, another one of the driving arrays DA1 and DA2 may serve as a spare driving array, so as to increase the fabrication yield of the light emitting unit LU. Such design may avoid discarding the whole substrate 1021 with all the light emitting units LU due to any defect of the driving array DA1 or the driving array DA2, and thus the manufacturing cost can be lowered.

Figure 5:
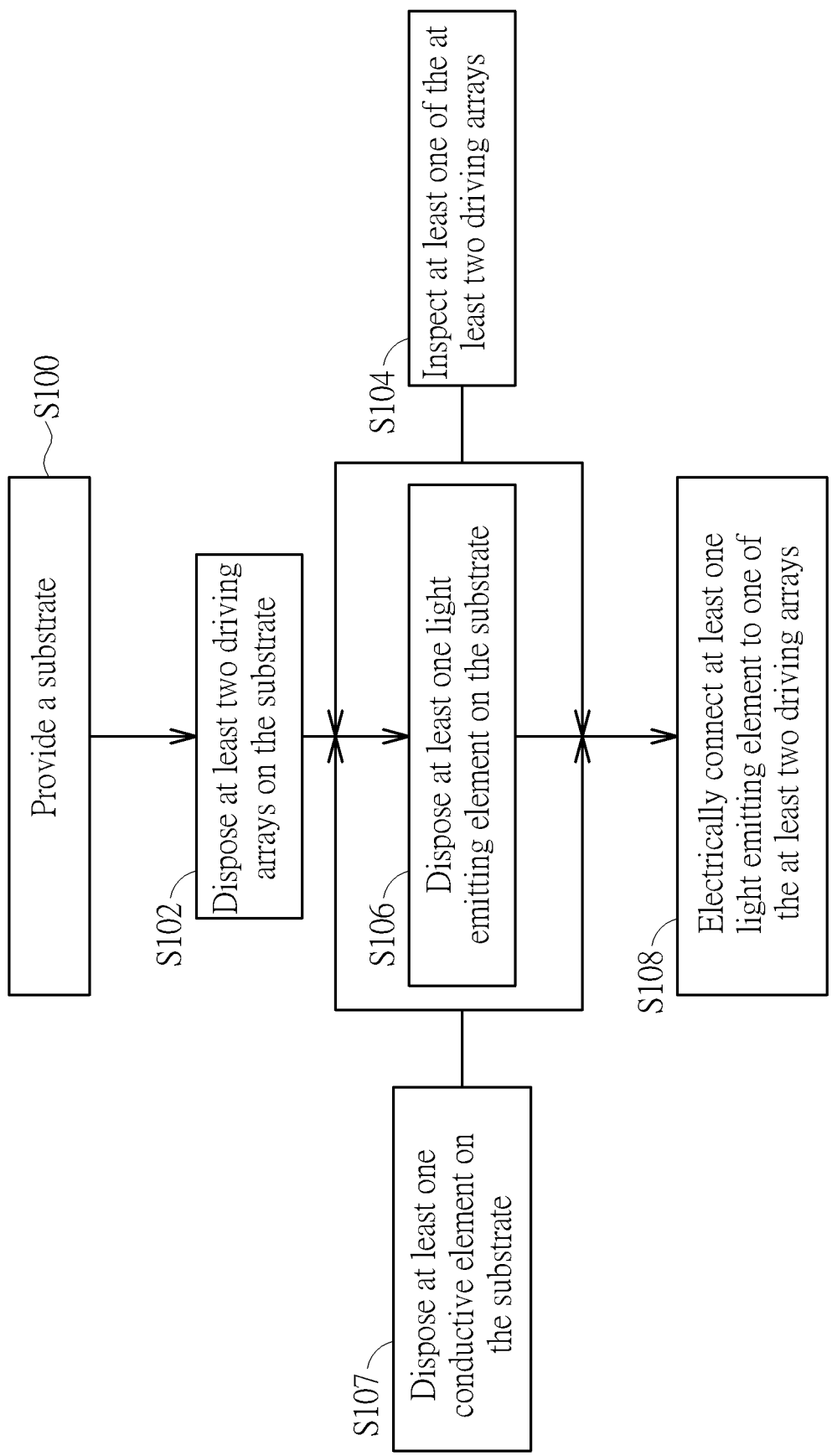
FIG. 5 is a schematic diagram of process flow of a manufacturing method of a display substrate according to the first embodiment of the present disclosure.

The present disclosure also provides a manufacturing method of the display substrate 200, such as (but not limited to) the manufacturing method of disposing the conductive element CE after disposing the light emitting element LE or disposing the conductive element CE before the light emitting element LE, as shown in FIG. 5. Referring to FIG. 1, FIG. 3, and FIG. 5, the above-mentioned display substrate 200 means a substrate that can provide light source, and the display substrate 200 may even be a substrate that can provide light with different brightness or different color in different regions. The display substrate 200 in this embodiment can serves as the backlight source 102 in FIG. 1. According to the present disclosure, the manufacturing method of the substrate 200 includes:

Step S100: Providing a substrate 1021;

Step S102: Disposing at least two driving arrays DA1, DA2 on the substrate 1021;

Step S104: Performing an inspection to one of the at least two driving arrays DA1, DA2, so as to confirm that at least one of the at least two driving arrays DA1, DA2 is qualified;

Step S106: Disposing at least one light emitting element LE on the substrate 1021;

Step S107: Disposing at least one conductive element CE on the substrate; and

Step S108: Electrically connecting the at least one light emitting element LE to one of the at least two driving arrays DA1, DA2, that is, electrically connecting the light emitting element LE to the qualified driving array.

In detail, referring to FIG. 2, a plurality of light emitting units LU may be disposed on the substrate 1021 predeterminedly. As shown in FIG. 3, every light emitting unit LU includes at least one light emitting element LE and at least two driving arrays DA1, DA2 (that is, at least one light emitting element LE and at least two driving arrays DA1, DA2 compose one light emitting unit LU), and a predetermined position CR1 and a predetermined position CR2 for disposing the conductive element CE may be reserved between the light emitting element LE and the driving arrays DA1, DA2. In the present disclosure, the light emitting unit LU can be defined as the following: when the conductive element CE is disposed on the predetermined position CR1 or CR2, the conductive element CE will not cross over (will not be electrically connected to) other conductive lines that are in the same layer as the conductive element CE. Accordingly, the light emitting element LE and the driving arrays DA1 and DA2 that have the above-mentioned characteristic of without crossing over other conductive lines will be considered as belonging to the same light emitting unit LU. During manufacturing, when the driving array DA1 passes the inspection and is qualified (Step S104), the conductive element CE will be disposed at the predetermined position CR1. Through the conductive element CE, the driving array DA1 is electrically connected to the light emitting element LE. On the other hand, since no conductive element CE will be disposed in the predetermined position CR2, the driving array DA2 is electrically isolated from the light emitting element LE and the driving array DA2 may be considered as a redundant array. In some circumstances, if the driving array DA1 does not pass the inspection, a further inspection to the driving array DA2 may be performed. If the driving array DA2 is confirmed to pass the inspection and be a qualified driving array, the conductive element CE may be disposed at the predetermined position CR2 to electrically connect the driving array DA2 to the light emitting element LE. In such circumstances, the driving array DA1 may be considered as a redundant array because it is electrically isolated from the light emitting element LE, and meanwhile the driving array DA2 can be considered as the driving array of the light emitting element LE since it is electrically connected to the light emitting element LE. The procedure of disposing the conductive element CE may be performed before or after Step S106. Next, referring to FIG. 5, the procedure of Step S104 of inspecting the quality of the driving arrays DA1, DA2 may be performed before or after Step S106 of disposing the light emitting element LE on the substrate 1021. The method of inspecting the driving arrays DA1, DA2 may for example include inspecting the current and/or the voltage of the driving arrays DA1, DA2 through a probe and pin(s) or connection pad(s) on the substrate 1021, so as to discover whether the driving arrays DA1, DA2 are qualified or have defects. Furthermore, in a variant embodiment, FIG. 5 illustrates that the conductive element CE is disposed after or before disposing the light emitting element LE on the substrate 1021, for instance.

The display device and the manufacturing method of the display substrate of the present disclosure are not limited to the above embodiments. The following description will detail other embodiments or variant embodiments of the present disclosure. For simplifying the description and making it easier to compare the difference between the embodiments and variant embodiments, the same components are denoted by the same symbols in the following, and the repeated part will not be redundantly described. Besides, each element or material in the following embodiments of the present disclosure may refer to the above embodiments, therefore will not be redundantly described.

Figure 6:
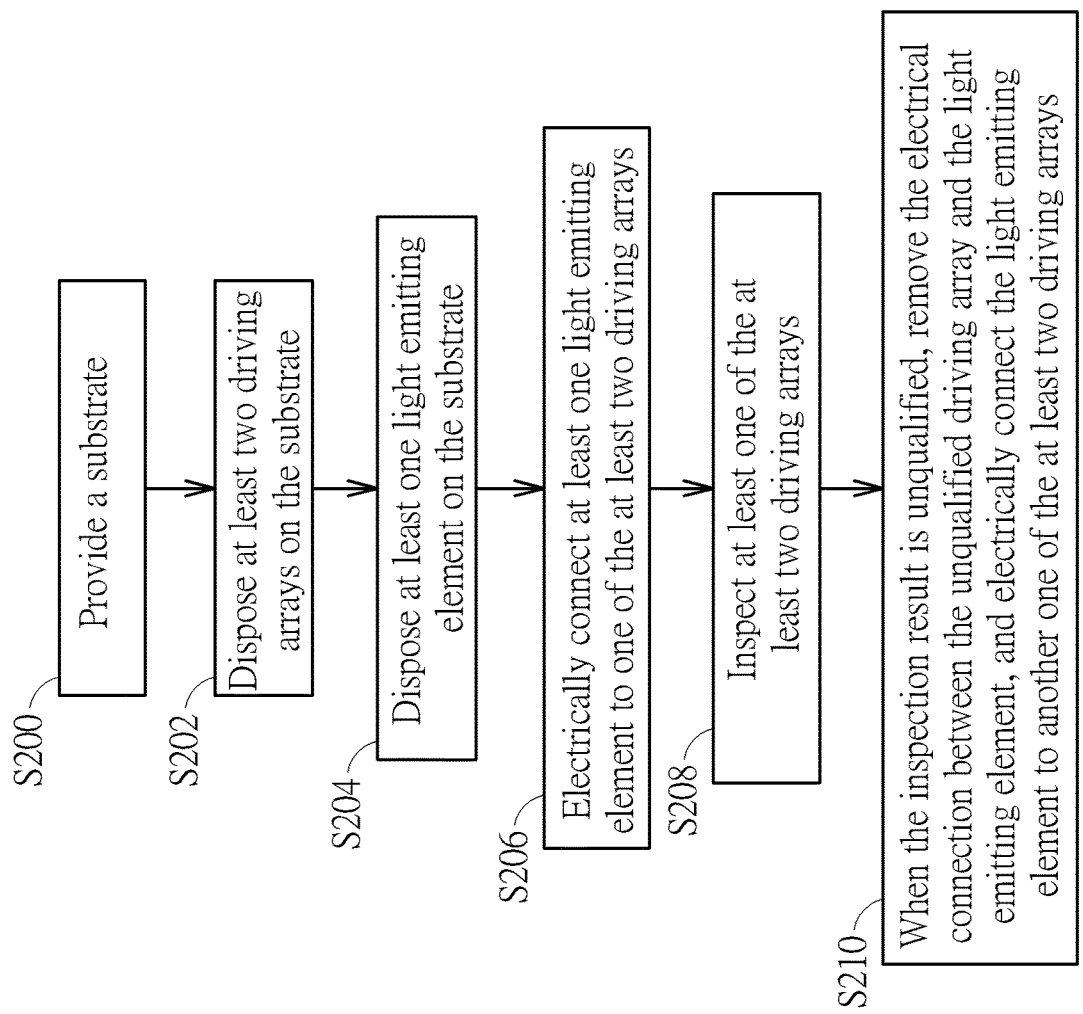
FIG. 6 is a schematic diagram of process flow of a manufacturing method of a display substrate according to another embodiment of the present disclosure.

Referring to FIG. 6, FIG. 6 is a schematic diagram of process flow of a manufacturing method of a display substrate according to another embodiment of the present disclosure. The manufacturing method of the display substrate of this embodiment includes the following steps:

Step S200: Providing a substrate 1021;

Step S202: Disposing at least two driving arrays DA1, DA2 on the substrate 1021;

Step S204: Disposing at least one light emitting element LE on the substrate 1021;

Step S206: Electrically connecting the at least one light emitting element LE to one of the at least two driving arrays DA1, DA2;

Step S208: Inspecting at least one of the at least two driving arrays DA1, DA2, that is, at least inspect the driving array DA1 or DA2 that is electrically connected to the light emitting element LE, so as to confirm whether the inspected driving array DA1 or DA2 is qualified; and Step S210: When the inspection result is unqualified, removing the electrical connection between the unqualified driving array and the light emitting element and electrically connecting the light emitting element to another one of the at least two driving arrays. That is, when the inspection result of Step S208 is unqualified, remove the electrical connection between the unqualified driving array DA1 or DA2 and the light emitting element LE, and electrically connect the light emitting element LE to another driving array DA1 or DA2 of the at least two driving arrays DA1, DA2.

In this embodiment, one of the two driving arrays DA1, DA2 is electrically connected to the light emitting element LE, after manufacturing the light emitting element LE or during manufacturing the light emitting element LE). For example, the conductive electrode CE can be disposed at the predetermined position CR1 to electrically connect the driving array DA1 to the light emitting element LE. After that, the inspection step is performed in order to find out whether the light emitting element LE can emit light normally or not by providing a signal to the light emitting element LE for example, so as to confirm whether the driving array DA1 electrically connected thereto is qualified or not. If the light emitting element LE can emit light normally, it is confirmed that the driving array DA1 electrically connected to the light emitting element LE is qualified; otherwise, the driving array DA1 is determined unqualified. In the later situation, the method of the present disclosure further includes forming an open circuit between the driving array DA1 and the light emitting element LE, such as using laser to cut the conductive line, and then disposing the conductive element CE at the predetermined position CR2, in order to electrically connect the driving array DA2 to the light emitting element LE to enable the light emitting element LE to emit light normally.

Figure 7:
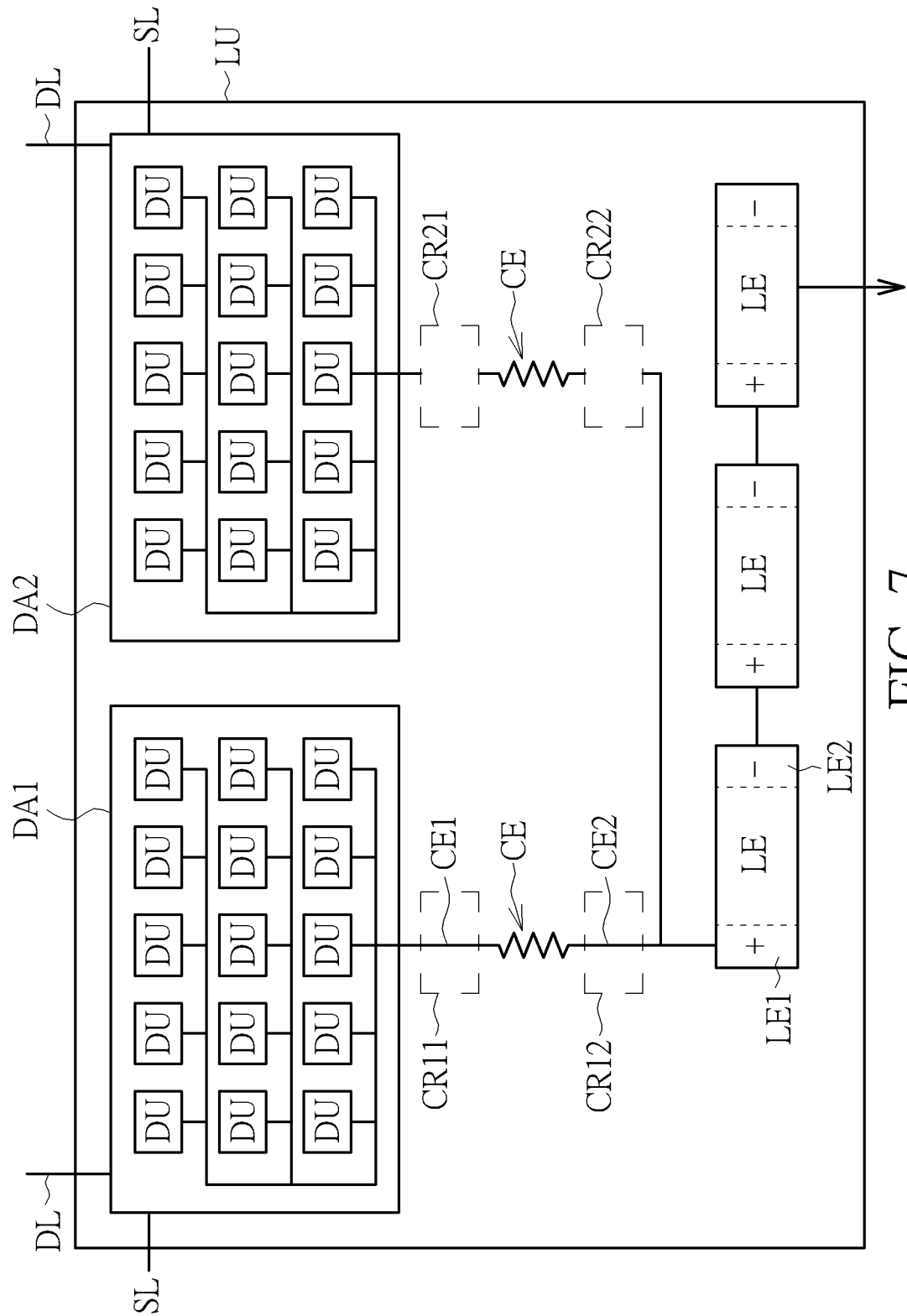
FIG. 7 is an element arrangement schematic diagram of a light emitting unit of the display device according to a second embodiment of the present disclosure.
Figure 8:
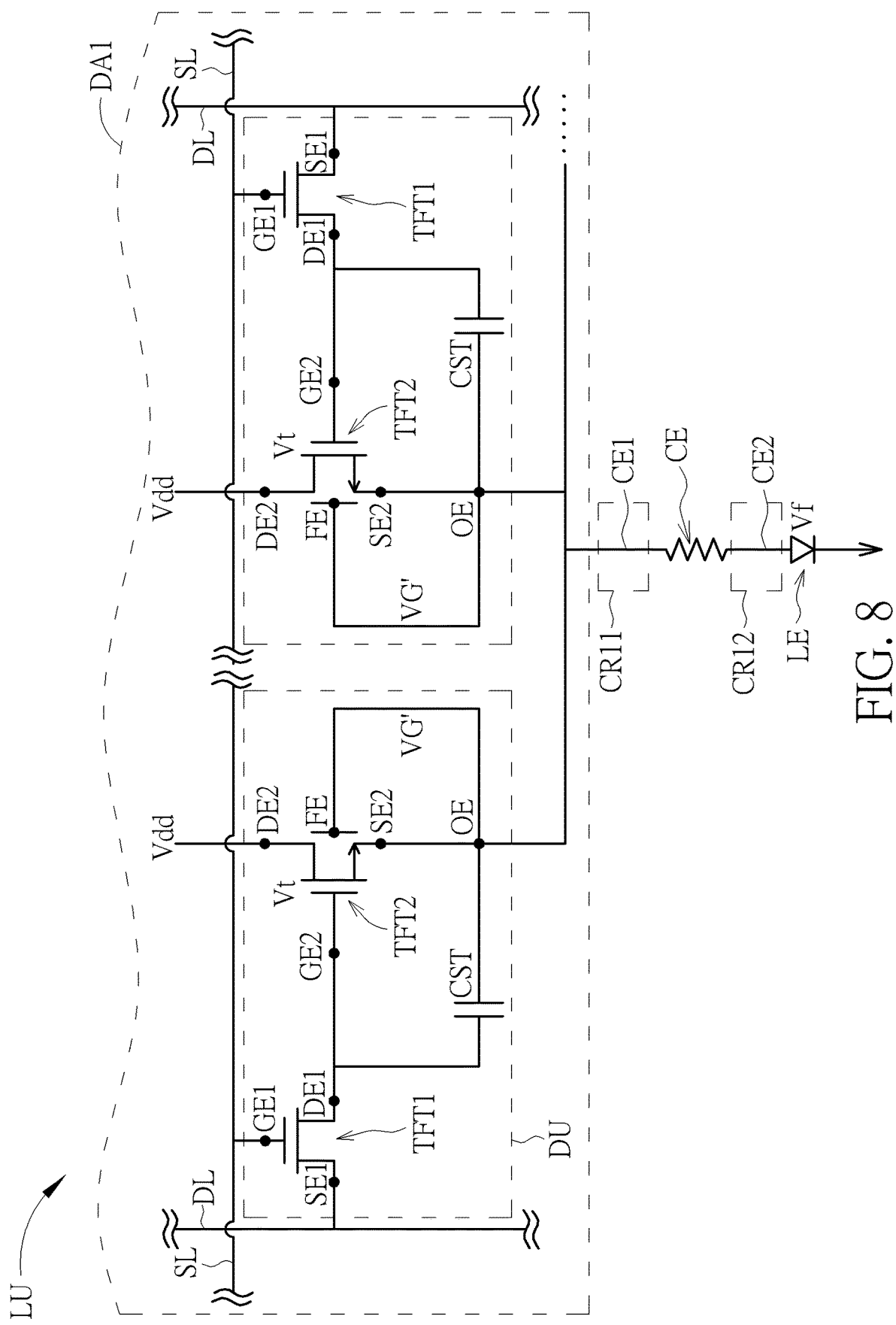
FIG. 8 is a partial equivalent circuit schematic diagram of one single driving array of the light emitting unit shown in FIG. 7.

Referring to FIG. 7 and FIG. 8, FIG. 7 is an element arrangement schematic diagram of a light emitting unit of the display device according to a second embodiment of the present disclosure, and FIG. 8 is a partial equivalent circuit schematic diagram of one single driving array of the light emitting unit shown in FIG. 7. In this embodiment, one single light emitting unit LU may include more than one light emitting elements LE that are electrically connected in series. In addition, in this embodiment, before performing the inspection, the conductive elements CE are disposed in each light emitting unit LU to correspond to the driving arrays DA1, DA2 respectively. The conductive elements CE may for example be resistors with zero resistance or with a resistance approaching to zero, and open circuits are formed between one or two terminals of the conductive elements CE and the driving arrays DA1, DA2 or the light emitting element LE. As shown in FIG. 7, in this embodiment, a predetermined position CR11 is reserved between the driving array DA1 and the corresponding conductive element CE, a predetermined position CR21 is reserved between the driving array DA2 and the corresponding conductive element CE, and a predetermined position CR12 and a predetermined position CR22 are reserved between the two conductive elements CE and the light emitting element LE. After performing an inspection to the driving arrays DA1, DA2, conductive elements (such as conductive lines or other elements that have low resistance) will be formed in the predetermined positions CR11, CR12 or the predetermined positions CR21, CR22 that are corresponding to the qualified driving array DA1 or DA2, such that the qualified driving array DA1 or DA2 is electrically connected to the light emitting element LE. Taking that the driving array DA1 is qualified as an example in FIG. 7 and FIG. 8, the conductive elements CE1, CE2 are disposed respectively in the predetermined positions CR11, CR12 after the inspection process, so as to electrically connect the driving array DA1 to the light emitting element LE. According to this embodiment, if the light emitting element LE is a LED element and the conductive element CE is a resistor, the conductive element CE may be disposed on the substrate 1021 together with the light emitting element LE when disposing the light emitting element LE on the surface of the substrate 1021 through surface mounting technology (SMT), thus no additional cost to manufacture the conductive element CE. Furthermore, as shown in FIG. 8 of this embodiment, the driving units DU are connected to each other in parallel and are arranged in one single driving array DA1 or DA2, such as in the driving array DA1. However, the positions of the elements in the driving unit DU may be mirror-symmetric, such as being mirror-symmetric in pairs, but not limited thereto.

Figure 9:
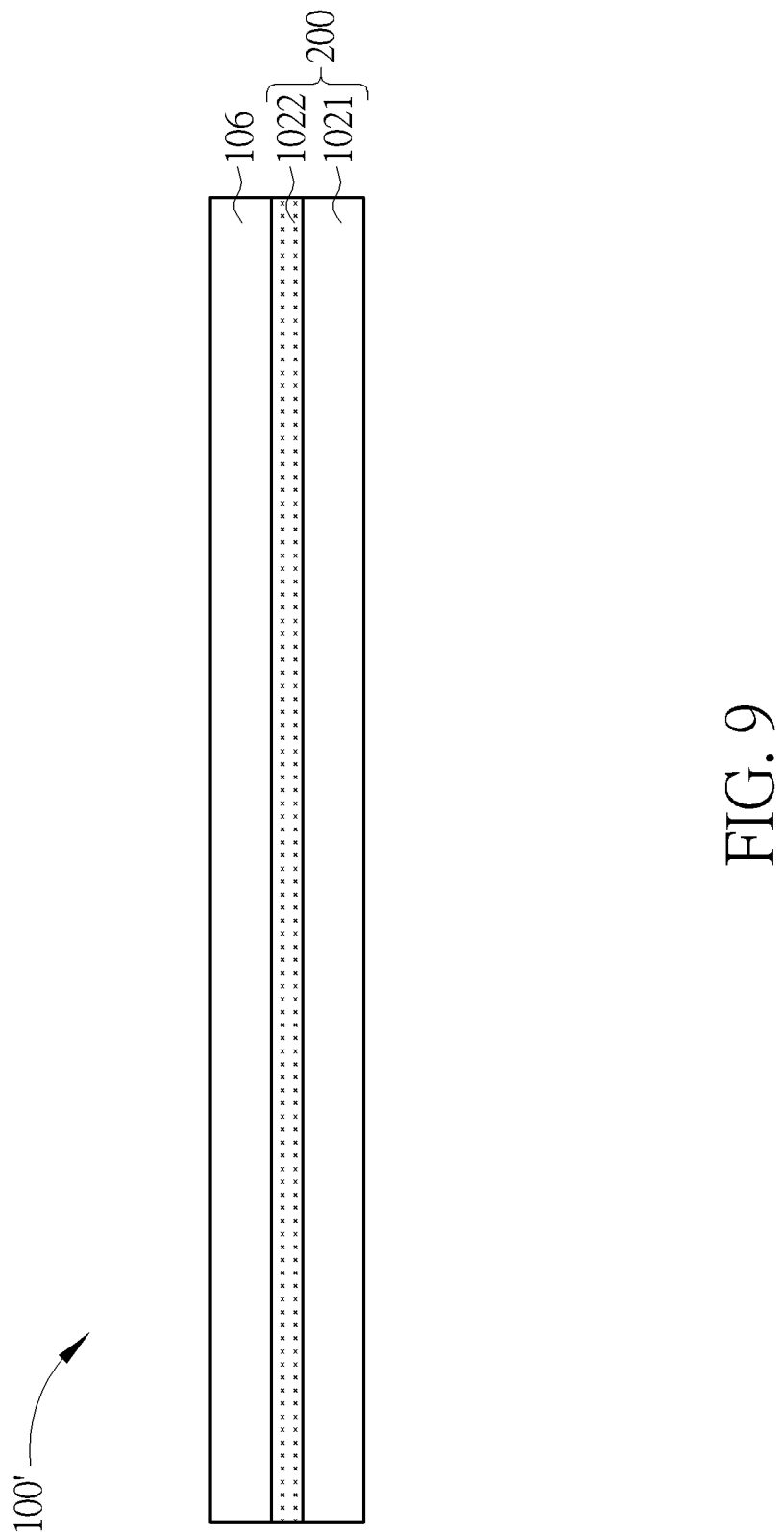
FIG. 9 is a cross-sectional schematic diagram of a structure of a display device according to a third embodiment of the present disclosure.
Figure 10:
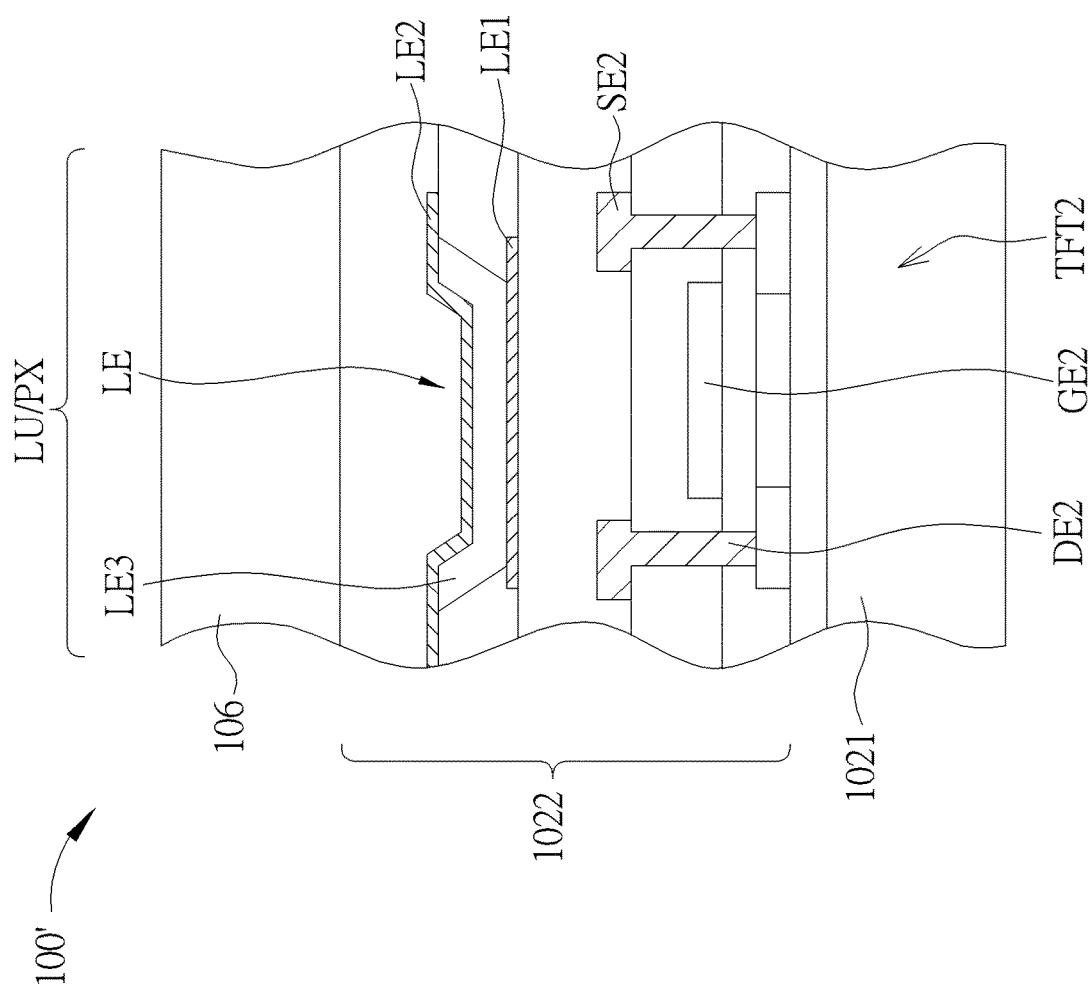
FIG. 10 is a partial-enlargement schematic diagram illustrating a cross-section of the display device shown in FIG. 9.

Referring to FIG. 9 and FIG. 10, FIG. 9 is a cross-sectional schematic diagram of a structure of a display device according to a third embodiment of the present disclosure, and FIG. 10 is a partial-enlargement schematic diagram illustrating a cross-section of the display device shown in FIG. 9. The display device 100' in this embodiment is a self-luminous display device and includes a display substrate 200, wherein the display substrate 200 may include the substrate 1021 and the light emitting array layer 1022 as mentioned in the above embodiments or variant embodiments. The light emitting array layer 1022 in this embodiment includes a plurality of light emitting units LU arranged in an array, and each light emitting unit LU includes at least two driving arrays and at least one light emitting element LE disposed on the surface of the substrate 1021, wherein the included elements, the arrangement and the electrical connection relationship of each of the light emitting units LU may refer to the above description and will not be described redundantly. For example, the light emitting element LE of this embodiment may be an OLED, but not limited thereto. In variant embodiments, the light emitting element LE may be other suitable elements, such as mini LED and micro LED. As shown in FIG. 10, the light emitting element LE includes a first terminal LE1, a second terminal LE2 and a light emitting layer LE3, wherein the first terminal LE1 and the second terminal LE2 may respectively serve as the anode and the cathode of the light emitting element LE. In addition, a second transistor TFT2 in the same light emitting unit LU disposed on the substrate 1021 is illustrated in FIG. 10, while other transistors that may exist in the light emitting unit LU are omitted in FIG. 10. The second transistor TFT2 in this embodiment is a top-gate type thin film transistor as an example; however, the second transistor TFT2 may be a bottom-gate type thin film transistor in a variant embodiment.

In one embodiment, one light emitting unit LU may be considered as one sub pixel PX of the display device 100'. The brightness of the light emitting element LE of each sub pixel PX may be controlled by the corresponding scan line and data line, and each sub pixel PX may have a light emitting element LE with non-identified color disposed therein as needed, so as to display colorful images. In another embodiment, when one light emitting unit LU includes more than one light emitting elements LE, all of the plural light emitting elements LE in one single light emitting unit LU may have the same color. Moreover, the display device 100' in this embodiment may further include another substrate 106 disposed on the light emitting array layer 1022 to provide protection. In addition, in the present disclosure, the another substrate 106 may also be a protection layer (such as a barrier layer), a glass or an inorganic-organic-inorganic (IOI) packaging layer without particular limitation, which has a mainly function of protecting the light emitting array or blocking moisture and oxygen.

From the above description, the substrate of the present disclosure that has the driving arrays and the light emitting elements disposed thereon may serve as a backlight source of the display panel in some embodiments; while the substrate itself may serve as the display panel that can produce one single color or multiple colors to display images in some other embodiments. The display device or the display substrate in the present disclosure has two or more driving arrays corresponding to the same light emitting element disposed on the substrate. When one of the driving arrays is failed, another driving array that functions normally may be selected to be electrically connected to the light emitting element, such that the light emitting element can emit light normally and the whole light emitting unit may function effectively. In other words, in one light emitting unit, there are two or more driving arrays, wherein one of the driving arrays is electrically connected to the light emitting element, and the other driving array(s) may be considered as redundant driving array (s). Such the design may achieve the purpose of repairing the defects of the circuit through selecting effective driving array, so as to avoid wasting the light emitting element or other elements on the substrate. In another aspect, the driving unit in the present disclosure has a driving transistor with four terminal electrodes (i.e., the second transistor mentioned above), which may increase the stability of the transistor and/or may additionally improve the light uniformity of the display substrate.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
   a substrate; and
   at least one light emitting unit, comprising:
   at least one light emitting element disposed on the substrate, wherein the at least one light emitting element has a first terminal and a second terminal; and
   at least two driving arrays disposed on the substrate, wherein one of the at least two driving arrays is electrically connected to the first terminal, and another one of the at least two driving arrays is electrically isolated from the first terminal.

2. The display device according to claim 1, wherein the one of the at least two driving arrays comprises:
   at least one data line;
   at least one scan line; and
   at least one driving unit, wherein one of the at least one driving unit comprises:
   a first transistor, wherein a source electrode of the first transistor is electrically connected to the at least one data line, and a gate electrode of the first transistor is electrically connected to the at least one scan line;

a second transistor, wherein a gate electrode of the second transistor is electrically connected to a drain electrode of the first transistor, and a source electrode of the second transistor is electrically connected to an output terminal of the driving unit; and a capacitor, wherein a first electrode of the capacitor is electrically connected to the drain electrode of the first transistor, and a second electrode of the capacitor is electrically connected to the output terminal of the driving unit.

3. The display device according to claim 1, wherein the one of the at least two driving arrays further comprises a plurality of driving units, and the plurality of driving units in the one of the at least two driving arrays are electrically connected to each other in parallel.

4. The display device according to claim 1, wherein the at least one light emitting element comprising a plurality of light emitting elements, and the plurality of light emitting elements are electrically connected in series.

5. The display device according to claim 1, further comprising a display panel disposed at a side of the substrate, wherein the at least one light emitting element is served as a backlight source of the display panel.

6. The display device according to claim 1, further comprising a conductive element disposed between the one of the at least two driving arrays and the at least one light emitting element, wherein the conductive element is electrically connected to the one of the at least two driving arrays and the at least one light emitting element.

7. The display device according to claim 6, wherein the conductive element comprises a conductive line or a Zener diode.

8. The display device according to claim 1, wherein the at least one light emitting unit comprises a plurality of light emitting units arranged in an array on the substrate.

9. The display device according to claim 8, wherein each of the plurality of light emitting units forms a sub pixel of the display device.

10. A manufacturing method of a display substrate, comprising:

providing a substrate;

disposing at least two driving arrays on the substrate;

inspecting at least one of the at least two driving arrays, so as to confirm that the at least one of the at least two driving arrays is qualified;

disposing at least one light emitting element on the substrate;

disposing at least one conductive element on the substrate;

electrically connecting the at least one light emitting element to the at least one of the at least two driving arrays that is qualified; and electrically isolating another one of the at least two driving arrays from the at least one light emitting element.

11. The manufacturing method of the display substrate according to claim 10, wherein disposing at least one conductive element on the substrate is performed before disposing the at least one light emitting element on the substrate.

12. The manufacturing method of the display substrate according to claim 10, wherein disposing at least one conductive element on the substrate is performed after disposing the at least one light emitting element on the substrate.

13. The manufacturing method of the display substrate according to claim 10, wherein performing an inspection to the at least one of the at least two driving arrays is performed before disposing the at least one light emitting element on the substrate.

14. The manufacturing method of the display substrate according to claim 10, wherein performing an inspection to the at least one of the at least two driving arrays is performed after disposing the at least one light emitting element on the substrate.

15. The manufacturing method of the display substrate according to claim 10, wherein the at least one of the at least two driving arrays comprises a plurality of driving units, and the plurality of driving units in the at least one of the at least two driving arrays are electrically connected to each other in parallel.

16. The manufacturing method of the display substrate according to claim 10, wherein disposing the at least one light emitting element on the substrate comprises disposing a plurality of light emitting elements on the substrate, and the plurality of light emitting elements are electrically connected in series.

17. The manufacturing method of the display substrate according to claim 10, wherein the at least one conductive element is electrically connected to the at least one of the at least two driving arrays and the at least one light emitting element.

18. The manufacturing method of the display substrate according to claim 17, wherein the at least one conductive element comprises a conductive line or a Zener diode.

19. A manufacturing method of a display substrate, comprising:

providing a substrate;

disposing at least two driving arrays on the substrate;

disposing at least one light emitting element on the substrate; and electrically connecting the at least one light emitting element to one of the at least two driving arrays;

inspecting the one of the at least two driving arrays; and when an inspection result confirmed that the one of the at least two driving arrays is unqualified, removing electrical connection between the one of the at least two driving arrays and the at least one light emitting element.

* * * * *